(12) United States Patent
Song et al.

(10) Patent No.: US 8,872,685 B2
(45) Date of Patent: Oct. 28, 2014

(54) TECHNIQUES TO REDUCE HARMONIC DISTORTIONS OF IMPEDANCE ATTENUATORS FOR LOW-POWER WIDEBAND HIGH-RESOLUTION DACS

(71) Applicant: QUALCOMM Incorporated, San Diego, CA (US)

(72) Inventors: Tongyu Song, San Diego, CA (US); Sang Min Lee, San Diego, CA (US); Derui Kong, San Diego, CA (US); Dongwon Seo, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/839,763

(22) Filed: Mar. 15, 2013

(65) Prior Publication Data

US 2014/0266830 A1 Sep. 18, 2014

(51) Int. Cl.
*H03M 1/00* (2006.01)
*H03M 1/74* (2006.01)

(52) U.S. Cl.
CPC ........................................ *H03M 1/74* (2013.01)
USPC ............ 341/144; 341/162; 341/126; 341/136; 341/161; 341/135

(58) Field of Classification Search
CPC ......... H03M 1/00; H03M 1/44; H03M 1/069; H03M 1/742; H03M 1/1225; H03M 1/0682; H03M 1/685; H03M 1/0624; H03M 1/0872; H03M 1/747; H03F 1/08; H03F 2200/36; H03F 3/45183; H03K 19/00384
USPC .................................................. 341/130–165
See application file for complete search history.

(56) References Cited

U.S. PATENT DOCUMENTS

| 6,191,719 | B1 * | 2/2001 | Bult et al. ...................... 341/144 |
| 6,353,404 | B1 | 3/2002 | Kuroiwa |

(Continued)

FOREIGN PATENT DOCUMENTS

| CN | 101060334 A | 10/2007 |
| JP | 59012603 | 1/1984 |

(Continued)

OTHER PUBLICATIONS

Chen F. et al., "Design of a wideband low-power continuous-time I GBP I modulator in 90 nm CMOS technology", Analog Integrated Circuits and Signal Processing, Kluwer Academic Publishers, BO, vol. 54, No. 3, Feb. 15, 2008, pp. 187-199, XP019569109.

(Continued)

*Primary Examiner* — Lam T Mai
(74) *Attorney, Agent, or Firm* — Arent Fox LLP (57) ABSTRACT

A digital-to-analog converter (DAC) includes, in part, a multitude of input stages that supply currents to a pair of current summing nodes in response to a digital signal, and an impedance attenuator coupled between the current summing nodes and the output of the DAC. The impedance attenuator is adapted, among other function, to increase the range of impedances of the output load, to account for changes in the output load impedance due to variations in the process, voltage and temperature, and to decouple the impedances seen by the summing nodes from the load impedance. The impedance attenuator further includes a differential-input, differential-output amplifier with programmable common-mode gain bandwidth to control the harmonic distortion of the amplifier. The impedance attenuator optionally includes a pair of cross-coupled capacitors to control the harmonic distortion of the amplifier.

47 Claims, 7 Drawing Sheets

(56) References Cited

U.S. PATENT DOCUMENTS

| | | | |
|---|---|---|---|
| 6,417,793 | B1 | 7/2002 | Bugeja et al. |
| 6,518,906 | B2 | 2/2003 | Abel et al. |
| 6,535,482 | B1 | 3/2003 | Hadi et al. |
| 6,566,951 | B1 | 5/2003 | Merrigan et al. |
| 6,605,990 | B2 | 8/2003 | Vermeeren |
| 6,668,164 | B2 | 12/2003 | Hughes |
| 6,738,006 | B1 | 5/2004 | Mercer et al. |
| 6,900,752 | B2 | 5/2005 | Oda et al. |
| 7,058,371 | B2 | 6/2006 | Li et al. |
| 7,158,065 | B2 | 1/2007 | Lin et al. |
| 7,199,742 | B2 | 4/2007 | Lin et al. |
| 7,415,286 | B2 | 8/2008 | Behzad |
| 7,528,754 | B1 | 5/2009 | Bakkaloglu et al. |
| 7,696,823 | B2 | 4/2010 | Khorramabadi |
| 7,830,290 | B2 | 11/2010 | Chen et al. |
| 8,169,353 | B2 | 5/2012 | Seo et al. |
| 8,248,290 | B2 * | 8/2012 | Payne .................... 341/162 |
| 8,269,661 | B2 * | 9/2012 | Corsi et al. ............. 341/162 |
| 2004/0052212 | A1 | 3/2004 | Baillargeon |
| 2004/0080441 | A1 | 4/2004 | Plymale, Sr. et al. |
| 2007/0129030 | A1 | 6/2007 | Litmanen et al. |
| 2009/0101186 | A1 | 4/2009 | Hiroshiro et al. |
| 2009/0174587 | A1 | 7/2009 | Ogawa et al. |
| 2009/0201186 | A1 | 8/2009 | Huang et al. |
| 2011/0304394 | A1 | 12/2011 | Bult et al. |

FOREIGN PATENT DOCUMENTS

| | | |
|---|---|---|
| JP | H0722858 A | 1/1995 |
| JP | H10112654 A | 4/1998 |
| JP | 2004504738 A | 2/2004 |
| WO | WO-0193429 A2 | 12/2001 |

OTHER PUBLICATIONS

Lin et al., "A 12 bit 2.9 GS/s DAC With IM3 60 dBc Beyond 1 GHz in 65 nm CMOS," IEEE Journal of Solid-State Circuits, Dec. 1999, pp. 3285-3293, vol. 44, No. 12.

Pei, et al., "Design and modeling of a 12-bit SAR ADC IP with non-lumped capacitor array," 2010 2nd International Conference on Future Computer and Communication (ICFCC), May 2010, pp. 392-395.

Przyborowski. D. et al., "Development of a general purpose low-power small-area 10 bit current steering CMOS DAC", Mixed Design of Integrated Circuits&Systems, 2009. MIXDES 09. MIXDES—16th International Conference, IEEE, Piscataway, NJ, USA, Jun. 25, 2009, pp. 256-261, XP031548247.

Wikner J.J., et al., "Modeling of CMOS digital-to-analog converters for telecommunication", IEEE Transactions on Circuits and Systems II: Analog and Digital Signal Processing, May 1999, pp. 489-499, vol. 46, No. 5.

* cited by examiner

TECHNIQUES TO REDUCE HARMONIC DISTORTIONS OF IMPEDANCE ATTENUATORS FOR LOW-POWER WIDEBAND HIGH-RESOLUTION DACS

BACKGROUND

The present disclosure relates to electronic circuits, and more particualry to a digital-to-analog converter.

A digital-to-analog converter (DAC) is an electronic circuit that converts a digital signal to an analog signal. A number of parameters are used to determine the suitability of a DAC for any given application. Among these parameters are the speed at which the DAC performs the digital-to-analog conversion, the resolution, as well as the harmonic distortion of the DAC.

A wireless communication device, such as a cellular phone, often uses a high speed, high resolution DAC to convert a digital signal to an analog signal for further processing by the analog circuits disposed in the communication device. Low noise, low power, wideband, high resolution DACs are increasingly important for advanced wireless standards, such as the long term evolution (LTE) standard.

BRIEF SUMMARY

A digital-to-analog converter (DAC), in accordance with one embodiment of the present invention, includes, in part, a multitude of input stages that supply currents to a pair of current summing nodes in response to a digital signal received by the DAC, and an impedance attenuator coupled between the current summing nodes and the output of the DAC. The impedance attenuator is adapted, among other functions, to increase the range of impedances of the output load, to account for changes in the output load impedance due to variations in the process, voltage and temperature, and to decouple the load impedance from impedances that may be present between the current summing nodes and the input stages. In some embodiments, the impedance attenuator includes a differential-input, differential-output amplifier with programmable common-mode gain bandwidth to control the harmonic distortion of the amplifier. In other embodiments, the impedance attenuator includes a pair of cross-coupled capacitors to control the harmonic distortion of the amplifier.

A DAC, in accordance with one embodiment of the present invention, includes, in part, a multitude of input stages, first and second transistors, and an amplifier. The input stages deliver currents to first and second current summing nodes of the DAC in response to a digital signal received by the DAC. The first transistor has a first terminal coupled to the first current summing node, and a second terminal coupled to a first output node of the DAC. The second transistor has a first terminal coupled to the second current summing node, and a second terminal coupled to a second output node of the DAC. The amplifier has a first differential input terminal coupled to the first terminal of the first transistor, a second differential input terminal coupled to the first terminal of the second transistor, a first differential output terminal coupled to a gate terminal of the first transistor, and a second differential output terminal coupled to a gate terminal of the second transistor. The amplifier is adapted to maintain the impedance of each of the first and second current summing nodes within a range defined by a gain of the amplifier.

In one embodiment, the DAC further includes first and second capacitors. The first capacitor is coupled between the gate terminal of the first transistor and the second current summing node. The second capacitor is coupled between the gate terminal of the second transistor and the first current summing node. The first and second capacitors reduce the harmonic distortion of the amplifier.

In one embodiment, the amplifier further includes a third input terminal receiving a control signal adapted to vary the common-mode gain of the amplifier. In one embodiment, the amplifier further receives a reference voltage defining a common-mode input voltage of the amplifier. In one embodiment, the amplifier further includes a differential cascode input stage, a differential source-follower amplification stage, a common-mode feedback loop, and a frequency compensation block. In one embodiment, the differential cascode is a folded cascode.

In one embodiment, the frequency compensation block includes a multitude of variable capacitors and resistors used to compensate for frequency response of the amplifier for both differential mode and common mode. In one embodiment, the common-mode feedback loop is adapted to define the common-mode input voltage of the amplifier in accordance with the reference voltage. In one embodiment, the common-mode feedback loop includes an input transistor that receives the reference voltage and forms a differential pair with a pair of input transistors disposed in the differential cascode.

In one embodiment, the control signal varies the harmonic distortion of the amplifier by selecting the channel-width to channel-length ratio of the input transistor of the common-mode feedback loop. In one embodiment, the control signal varies the harmonic distortion of the amplifier by varying the currents of one or more current sources disposed in the common-mode feedback loop. In one embodiment, the control signal varies the capacitances of one or more variable capacitors and/or resistances of one or more variable resistors disposed in the frequency compensation block to compensate for frequency response of the amplifier.

A DAC, in accordance with one embodiment of the present invention, includes, in part, a multitude of input stages, first and second transistors, first and second amplifiers, and first and second capacitors. The input stages are adapted to deliver currents to first and second current summing nodes of the DAC in response to a digital signal received by the DAC. The first transistor has a first terminal coupled to the first current summing node, and a second terminal coupled to a first output node of the DAC. The second transistor has a first terminal coupled to the second current summing node, and a second terminal coupled to a second output node of the DAC. The first amplifier has a first input terminal coupled to the first terminal of the first transistor, a second input terminal receiving a reference voltage, and an output terminal coupled to a gate terminal of the first transistor. The second amplifier has a first input terminal coupled to a first terminal of the second transistor, a second input terminal receiving the reference voltage, and an output terminal coupled to a gate terminal of the second transistor. The first capacitor is coupled between the gate terminal of the first transistor and the second current summing node. The second capacitor is coupled between the gate terminal of the second transistor and the first current summing node.

A method of converting a digital signal to an analog signal, in accordance with one embodiment of the present invention, includes, in part, delivering first and second currents to first and second current summing nodes respectively in response to the digital signal, and coupling the first and second current summing nodes to first and second input terminals of a differential amplifier.

The method further includes varying the conductivity of a first current path in response to changes in the voltage of the first current summing node using the differential amplifier. The first path is adapted to couple the first current summing node to a first differential voltage representing the analog output voltage. By changing the conductivity of the first path in response to changes in the voltage of the first current summing node, the impedance of the first current summing node is maintained within a range defined by the gain of differential amplifier.

The method further includes varying the conductivity of a second current path in response to changes in the voltage of the second current summing node using the differential amplifier. The second path is adapted to couple the second current summing node to a second differential voltage representing the analog output voltage. By changing the conductivity of the second path in response to changes in the voltage of the second current summing node, the impedance of the second current summing node is maintained within a range defined by the gain of differential amplifier.

BRIEF DESCRIPTION OF THE DRAWINGS

Aspects of the disclosure are illustrated by way of example. In the accompanying figures, like reference numbers indicate similar elements, and.

DETAILED DESCRIPTION

Several illustrative embodiments will now be described with respect to the accompanying drawings, which form a part hereof. While particular embodiments, in which one or more aspects of the disclosure may be implemented, are described below, other embodiments may be used and various modifications may be made without departing from the scope of the disclosure.

A digital-to-analog converter (DAC), in accordance with one embodiment of the present invention, includes, in part, a multitude of input stages that supply currents to a pair of current summing nodes in response to a digital signal received by the DAC, and an impedance attenuator coupled between the current summing nodes and the output of the DAC. The impedance attenuator is adapted, among other functions, to increase the range of impedances of the output load, to account for changes in the output load impedance due to variations in the process, voltage and temperature, and to decouple the load impedance from impedances that may be present between the current summing nodes and the input stages. In some embodiments, the impedance attenuator includes a differential-input, differential-output amplifier with programmable common-mode gain bandwidth to control the harmonic distortion of the amplifier. In other embodiments, the impedance attenuator includes a pair of cross-coupled capacitors to control the harmonic distortion of the amplifier.

Figure 1:
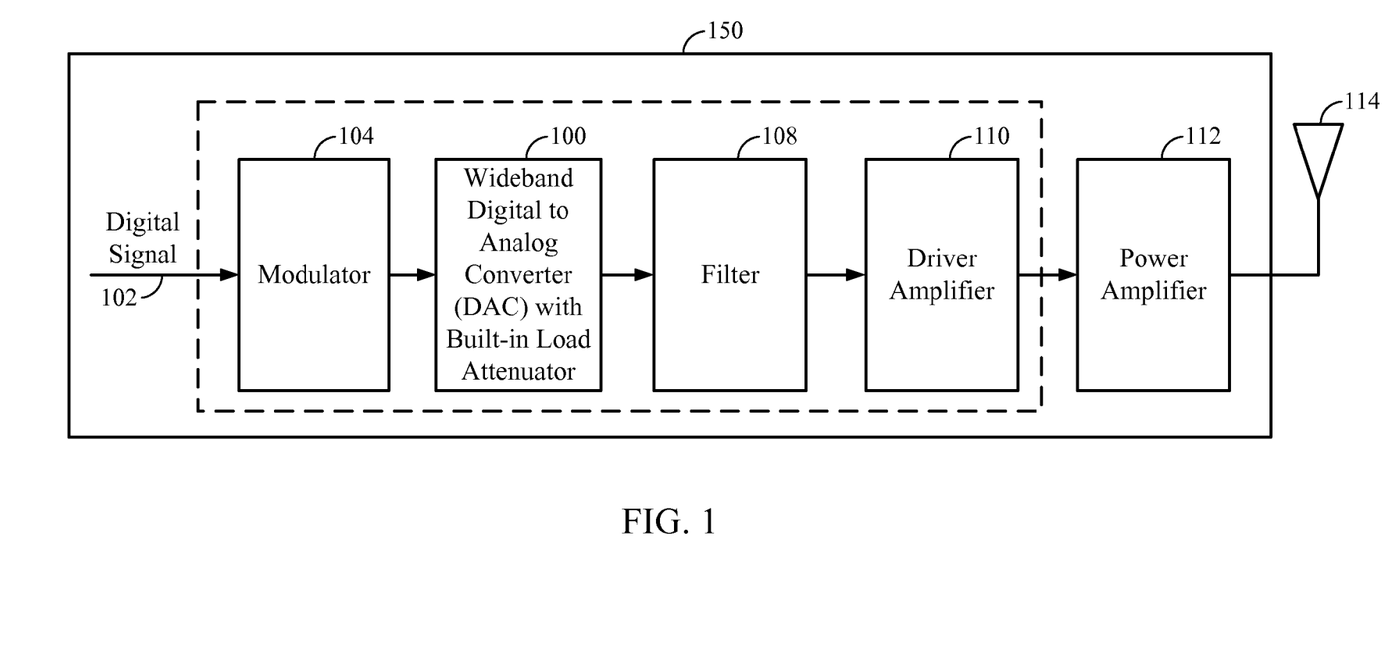
FIG. 1 is a block diagram of a wireless communication device in which various aspects of the present invention may be embodied.

FIG. 1 is a block diagram of a wireless communication device 150 (hereinafter alternatively referred to as device) used in a wireless communication system, in accordance with one embodiment of the present invention. Device 150 may be a cellular phone, a personal digital assistant (PDA), a modem, a handheld device, a laptop computer, and the like.

Device 150 may communicate with one or more base stations on the downlink (DL) and/or uplink (UL) at any given time. The downlink (or forward link) refers to the communication link from a base station to the device. The uplink (or reverse link) refers to the communication link from the device to the base station.

A wireless communication system may be a multiple-access system capable of supporting communication with multiple users by sharing the available system resources (e.g., bandwidth and transmit power). Examples of such systems include code division multiple access (CDMA) systems, time division multiple access (TDMA) systems, frequency division multiple access (FDMA) systems, orthogonal frequency division multiple access (OFDMA) systems, and spatial division multiple access (SDMA) systems.

Wireless communication device 150 may be used in wireless communication systems such as the long term evolution (LTE) systems. Wireless communication system 150 may be continuously operated at high data rates or bandwidths, thus requiring an increased bandwidth for the DACs used therein. An increased bandwidth may require a wideband DAC implemented on a system-on-a-chip capable of handling a wide range of frequencies and digital pre-distortion operations. The pre-distortion operation may enable the use of low-cost non-linear power amplifiers in such wireless systems.

Device 150 is shown as including, in part, modulator 104, DAC 100, filter 108 and amplifier 110, which collectively form a transmission channel. Modulator 104 is adapted to modulate incoming digital signal 102 and supply the modulated signal to DAC 100. As described further below, DAC 100 has a built-in load (impedance) attenuator. The converted signal is filtered by filter 108 and amplified by amplifier 110. The amplified signal generated by amplifier 110 may be further amplified using a power amplifier 112 before being transmitted by antenna 114.

Low-power wireless or consumer devices may require a DAC that operates with less current. In such applications, the dynamic linearity performance metrics that include the signal-to-noise distortion ratio (SNDR), spurious free dynamic range (SFDR) and total harmonic distortion (THD) are important system parameters.

Figure 2:
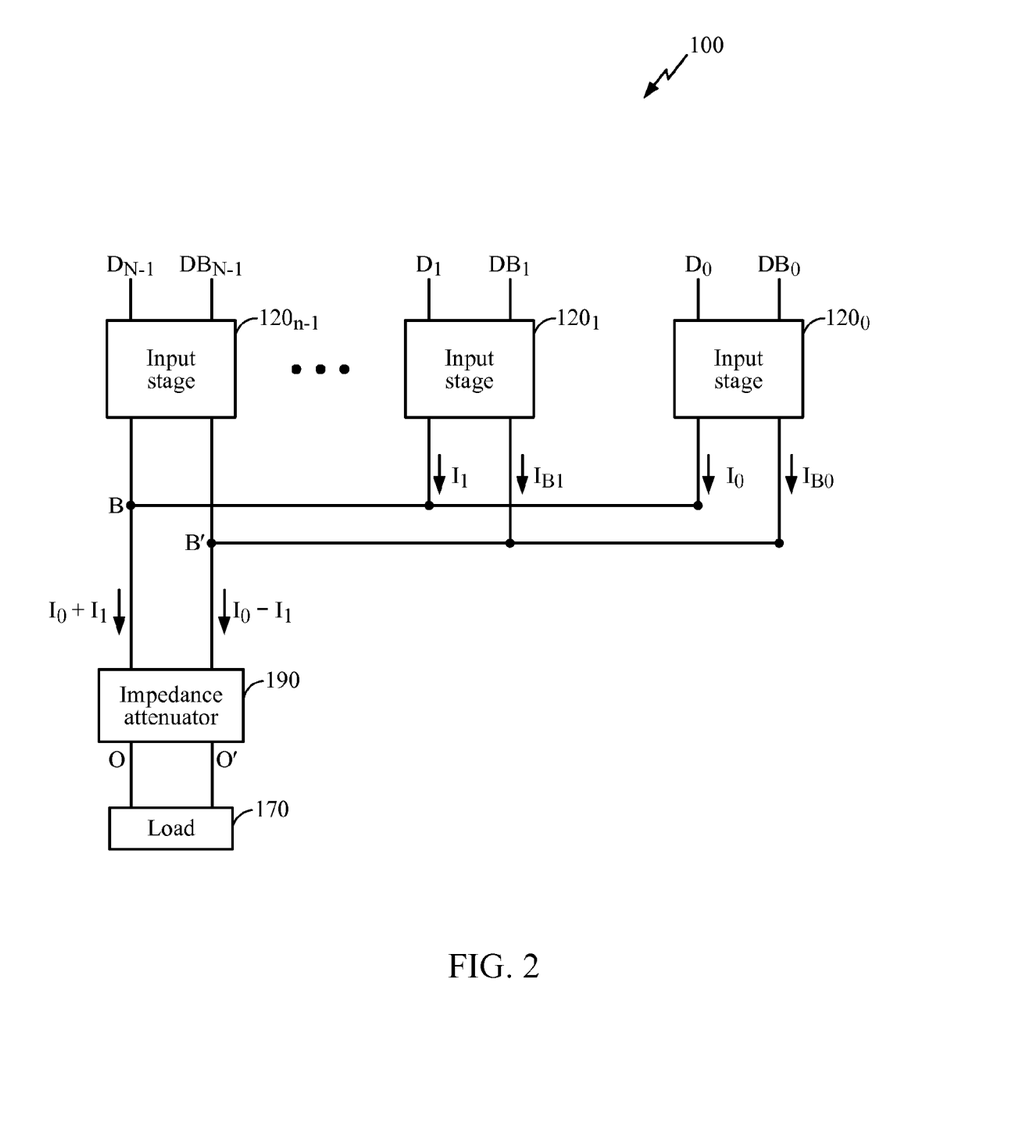
FIG. 2 is a simplified block diagram of a current steering DAC, in accordance with one exemplary embodiment of the present invention.

FIG. 2 is a block diagram of an N-bit current steering DAC 100 adapted to have a reduced harmonic distortion, in accordance with one exemplary embodiment of the present invention, where N is an integer. DAC 100 may be used in device 150 shown in FIG. 1. DAC 100 includes N input stages 120$i$ where i is an integer varying from 1 to N, and an impedance attenuator 190. Each input stage 120$i$ is adapted to receive differential data bits Di and DBi, generate differential currents Ii, IBi in response, and deliver the differential currents to summing nodes B, B' of the DAC. Impedance attenuator 190 receives differential currents (Io+Il) and (Io−Il) delivered to summing nodes B, B', and in response generates a pair of differential voltages across output nodes O, O' that represent the output voltage of DAC 100.

Impedance attenuator 190 advantageously increases the range of impedances that output load 170 may have. Impedance attenuator 190 is further adapted to account for changes in the output load impedance due to variations in the process, voltage and temperature. Consequently, in embodiments where all the input stages generate the same amount of current and have similar switch sizes, DAC 100 has a much smaller out-of-band noise variation across process, voltage and temperature than conventional DACs. Furthermore, in embodiments where a resistive network, such as an R-2R network, is used to scale the currents in one or more stages of the DAC, impedance attenuator 190 provides more flexibility in selecting the resistances of the resistive networks to ensure that SFDR and SNDR of DAC 100 fall within desired values. In other words, impedance attenuator 190, in accordance with the present invention, decouples the resistances of such resistive networks from the load resistance. Moreover, in some embodiments, impedance attenuator 190 includes a differential-input, differential-output amplifier with programmable common-mode gain bandwidth to control the harmonic distortion of the amplifier.

Figure 3:
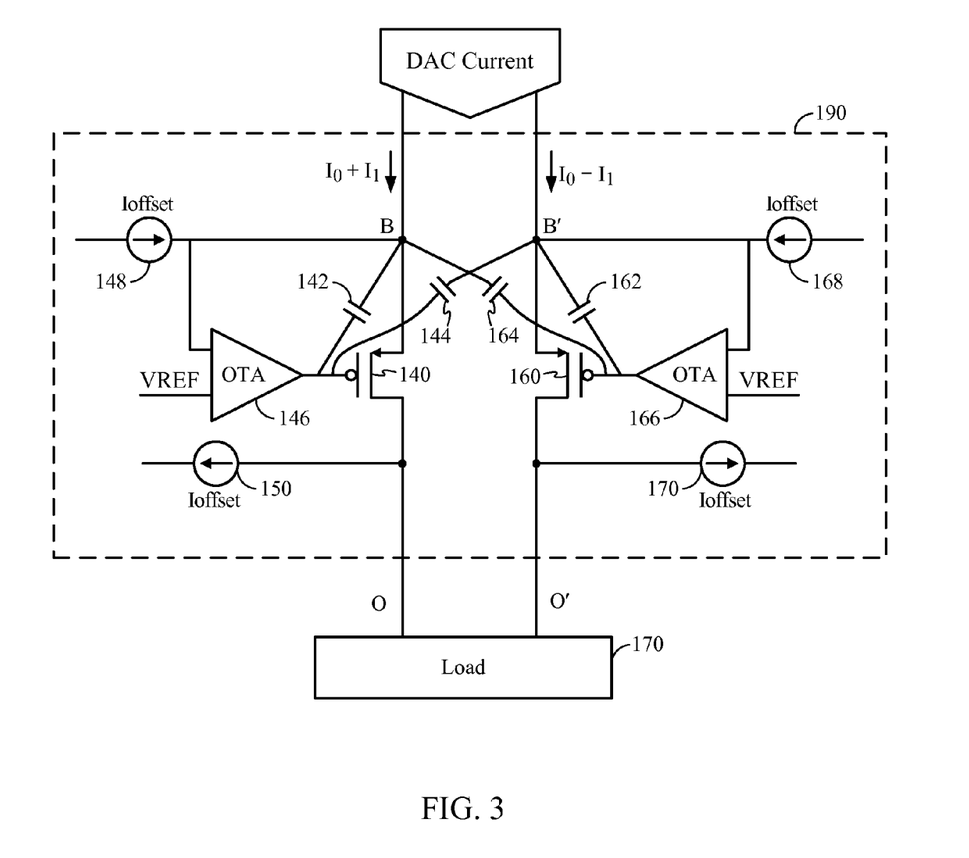
FIG. 3 is a simplified block diagram of a current steering DAC, in accordance with one exemplary embodiment of the present invention.

FIG. 3 is a simplified block diagram of an impedance attenuator 190 adapted to have a reduced harmonic distortion, in accordance with one embodiment of the present invention. Impedance attenuator 190 is shown as including, in part, transistors 140, 160, and single-ended amplifiers 146, 166. Current sources 148, 168 provide current Ioffset to nodes B, B' respectively, and current sinks 150, 170 withdraw current Ioffset from node O, O' respectively. Current sources 148, 168, and current sinks 150, 170 are adapted to maintain transistors 140, 160 in their active regions of operation. Impedance attenuator 190 is also shown as including, in part, capacitors 144 and 146. Also shown in FIG. 3 are capacitor 142 representing the gate-to-source parasitic capacitance of transistor 140, and capacitor 162 representing the gate-to-source parasitic capacitance of transistor 160.

Attenuator 190 is adapted to maintain the voltage difference between nodes B, B' within a relatively small range defined by the gain of amplifiers 146, 166. For example, if amplifiers 146, 166 have a DC gain of 60 dB, and the voltage difference between output nodes O, O' is 1V, the voltage difference between nodes B, B' is maintained at nearly 1 mv, as described further below.

Assume, for example, that DAC 100 steers more current to node B in response to a change at the input of the DAC. This causes the voltage at node B to increase. Because the input terminals of amplifier 146 have a relatively high impedance, the extra current delivered to node B is caused to flow through transistor 140, thereby causing the voltage at output node O to increase. Because of the gain of amplifier 146, any increase in the voltage at node B causes the voltage at the output of amplifier 146, i.e., the gate of transistor 140, to decrease by an even larger amount. Accordingly, the larger the increase in the voltage at node B due to extra current delivered to node B, the more conductive transistor 140 becomes to pass this extra current to node O—thus keeping the impedance of node B within a narrow range. In other words, amplifier 146 together with transistor 140 operate to maintain the impedance of node B within a narrow range defined by the gain of amplifier 146. Furthermore, due to the presence of virtual ground between the input terminals of amplifier 146, the voltage at node B remains close to reference voltage Vref.

Likewise, if more current is steered to node B' in response to a change at the input of the DAC, the voltage at node B' increases. Because the input terminals of amplifier 166 have a relatively high impedance, the extra current delivered to node B' is caused to flow through transistor 160, thereby causing the voltage at output node O' to increase. Because of the gain of amplifier 166, any increase in the voltage at node B' causes the voltage at the output of amplifier 166, i.e., the gate of transistor 160, to decrease by an even larger amount. Accordingly, the larger the increase in the voltage at node B' due to extra current delivered to node B', the more conductive transistor 160 becomes to pass this extra current to node O'—thus keeping the impedance of node B' within a narrow range. In other words, amplifier 166 together with transistor 160 operate to maintain the impedance of node B' within a narrow range defined by the gain of amplifier 166. Furthermore, due to the presence of virtual ground between the input terminals of amplifier 166, the voltage at node B' remains close to reference voltage Vref. Consequently, because the voltages of both nodes B and B' are close to Vref, the difference in the voltages of nodes B, B' is also maintained within a small range (Sang, can you please provide a numerical example of these voltages/currents). Impedance attenuator 190 is further described in U.S. Pat. No. 8,169,353.

Parasitic capacitances 142 and 146 may cause non-linearity in the output current of the DAC, i.e., the difference between the currents flowing through transistors 146 and 160. To reduce this non-linearity, in accordance with one embodiment of the present invention, impedance attenuator 190 is adapted to include capacitors 144 and 164.

As is seen, capacitor 144 is connected between the gate terminal of transistor 140 and the source terminal of transistor 160, i.e., node B'. Likewise, capacitor 164 is connected between the gate terminal of transistor 160 and the source terminal of transistor 140, i.e., node B. As was described above, capacitors 142 and 162 are the parasitic gate-to-source capacitances of transistors 140, and 160 respectively. Current withdrawn from (or injected to) node B via capacitor 142 is injected back to (or withdrawn from) node B via capacitor 164. Likewise, current withdrawn from (or injected to) node B' via capacitor 138 is injected back to (or withdrawn from) node B' via capacitor 144. Accordingly, cross-coupled capacitors 144 and 164 supply currents to offset the currents that may be withdrawn through capacitors 162 and 142, respectively. Likewise, cross-coupled capacitors 144 and 164 withdraw currents to offset the currents that may be supplied through capacitors 162 and 164, respectively. Accordingly, by offsetting currents that may be injected or withdrawn via parasitic capacitances 142, 162, capacitors 164, 144 reduce the harmonic distortion of impedance attenuator 190.

Figure 4:
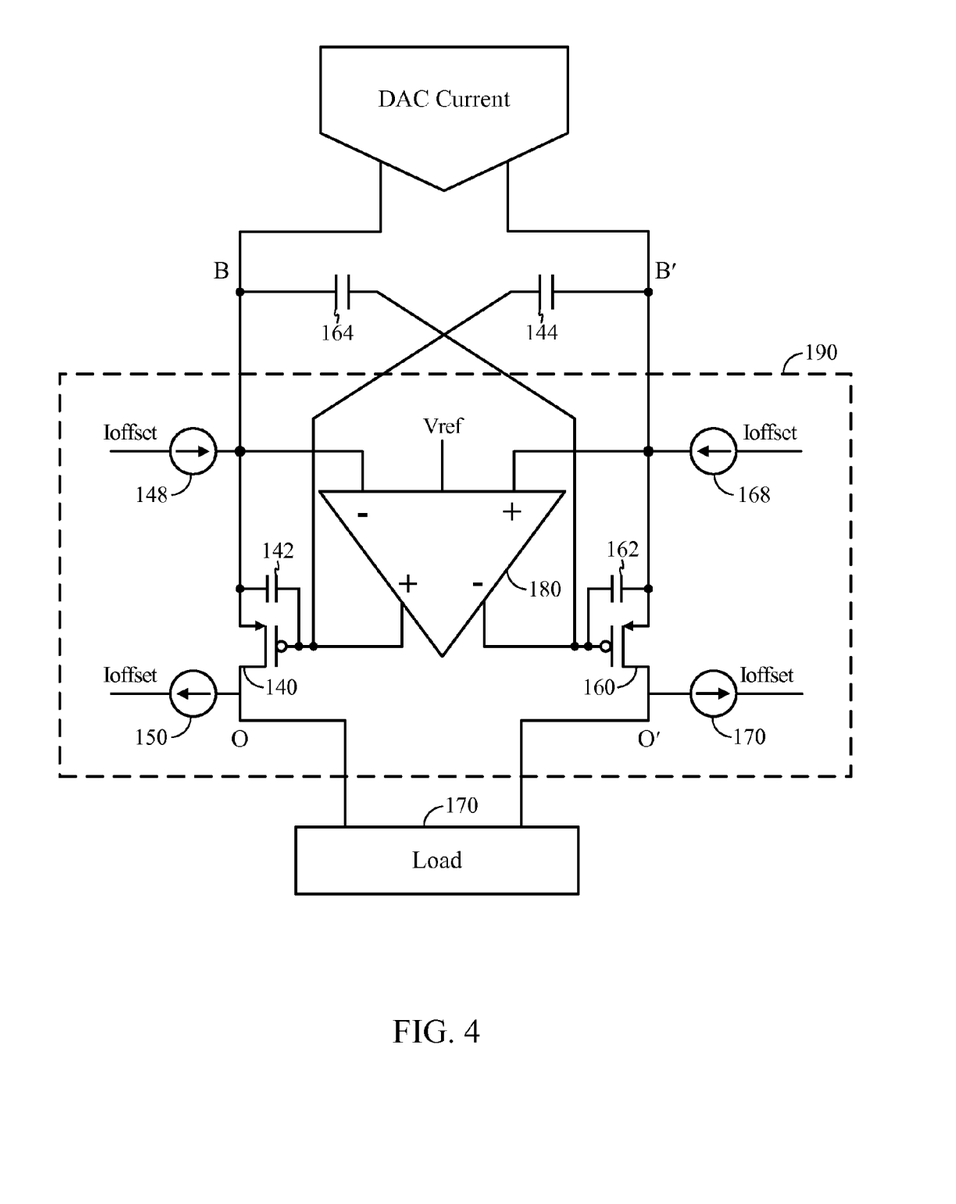
FIG. 4 is a simplified block diagram of a current steering DAC, in accordance with another exemplary embodiment of the present invention.

FIG. 4 is a simplified block diagram of an impedance attenuator 190 adapted to have a reduced harmonic distortion, in accordance with another exemplary embodiment of the present invention. Impedance attenuator 190 is shown as including, in part, transistors 140, 160, and differential-input differential-output amplifier 180. Current sources 148, 168 provide current Ioffset to nodes B, B' respectively, and current sinks 150 and 170 withdraw current Ioffset from node O, O' respectively. Current sources 148, 168, and current sinks 150, 170 are adapted to maintain transistors 140, 160 in their active regions of operation. Impedance attenuator 190 is also shown as including, in part, capacitors 144, 146. Also shown in FIG. 4 are capacitor 142 representing the parasitic gate-to-source capacitance of transistor 140, and capacitor 162 representing the parasitic gate-to-source capacitance of transistor 160.

Attenuator 190 shown in FIG. 4 is adapted to maintain the difference in voltages of nodes B, B', as well as the impedances of nodes B, B' within a relatively small range. For example, if amplifier 180 has a DC gain of 60 dB, and the voltage difference between output nodes O, O' is 1V, the voltage difference between nodes B, B' is maintained at nearly 1 mv, as described further below.

Assume, for example, that DAC 100 steers more current to node B in response to a change at the input of the DAC. This causes the voltage at node B to initially increase. Because the input terminals of amplifier 180 have a relatively high impedance, the extra current delivered to node B is caused to flow through transistor 140, thereby causing the voltage at output node O to increase. Due to the gain of amplifier 180, the voltage at the gate terminal of transistor 140 decreases by an amount larger than the increase in the voltage at node B. This causes transistor 140 to become more conductive to pass the extra current from node B to node O. Accordingly, the larger the increase in the voltage at node B due to any extra current delivered to node B, the more conductive transistor 140 becomes to pass this extra current to node O—thus keeping the impedance of node B within a narrow range. Therefore, the voltage at node B is adapted to vary by only a relatively small amount. For the same reasons, the voltage at node B's is also adapted to vary by only a relatively small amount. Accordingly, impedance attenuator 190 maintains the impedances of nodes B, B' within a very narrow range defined by the DC gain of amplifier 180. Furthermore, due to the presence of virtual ground between the input terminals of amplifier 180, amplifier 180 maintains the voltage difference between nodes B, B' within a very narrow range. (Sang, can you please provide a numerical example of these voltages/currents)

Parasitic capacitances 142 and 146 may cause non-linearity in the output current of the DAC, i.e., the difference between the currents flowing through transistors 140 and 160 to output nodes O, O'. To reduce this non-linearity, in accordance with one embodiment of the present invention, impedance attenuator 190 is adapted to include capacitors 144 and 164, as shown in FIG. 4.

As is seen, capacitor 144 is connected between the gate terminal of transistor 140 and the source terminal of transistor 160, i.e., node B'. Likewise, capacitor 164 is connected between the gate terminal of transistor 160 and the source terminal of transistor 140, i.e., node B. Capacitors 142 and 162 are the parasitic gate-to-source capacitances of transistors 140, and 160 respectively. Current withdrawn from (or injected to) node B via capacitor 142 is injected back to (or withdrawn from) node B via capacitor 164. Likewise, current withdrawn from (or injected to) node B' via capacitor 162 is injected back to (or withdrawn from) node B' via capacitor 144. Accordingly, cross-coupled capacitors 144 and 164 supply currents to offset the currents that may be withdrawn through capacitors 162 and 142, respectively. Likewise, cross-coupled capacitors 144 and 164 withdraw currents to offset the currents that may be supplied through capacitors 162 and 164, respectively. Accordingly, by offsetting currents that may be injected or withdrawn via parasitic capacitances 142, 162, capacitors 164 and 144 reduce the harmonic distortion of amplifier 180 of impedance attenuator 190 shown in FIG. 4.

Figure 5:
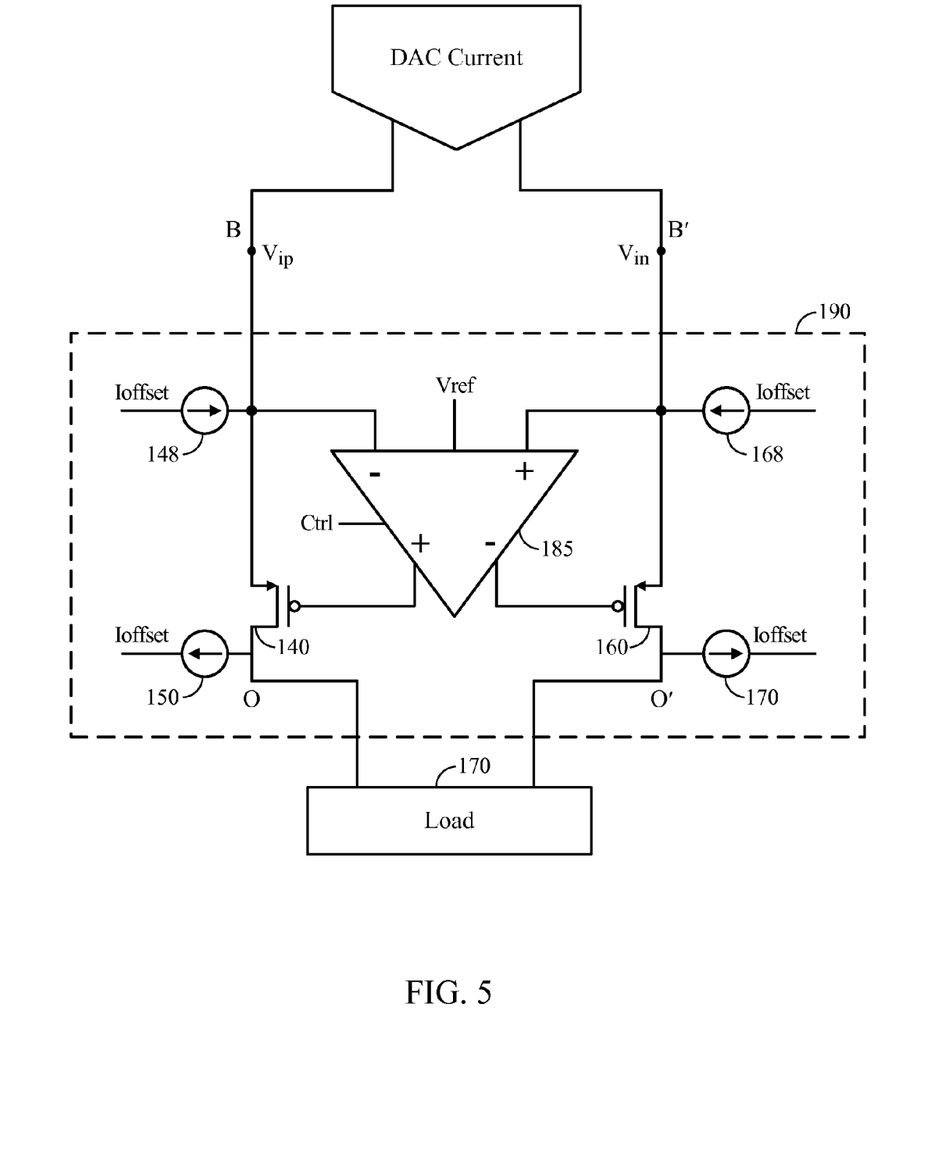
FIG. 5 is a simplified block diagram of a current-steering DAC, in accordance with another exemplary embodiment of the present invention.

FIG. 5 is a simplified block diagram of an impedance attenuator 190 adapted to have a reduced harmonic distortion, in accordance with another exemplary embodiment of the present invention. Impedance attenuator 190 is shown as including, in part, transistors 140, 160, and differential-input differential-output amplifier 185. Current sources 148, 168 provide current Ioffset to nodes B, B' respectively, and current sinks 150 and 170 withdraw current Ioffset from node O, O' respectively. Current sources 148, 168, and current sinks 150, 170 are adapted to maintain transistors 140, 160 in the active regions of operation. Impedance attenuator 190 of FIG. 5 is similar to impedance attenuator 190 of FIG. 4 except that amplifier 185 of impedance attenuator 190 of FIG. 5 also receives control signal CTRL that varies the harmonic distortion of amplifier 185 by varying the common-mode gain bandwidth product of amplifier 185. In other words, the common-mode gain bandwidth product of amplifier 185 may be varied to control the harmonic distortion of amplifier 185. Attenuator 190 of FIG. 5 is also adapted to maintain the impedances of nodes B, B' as well as the voltage difference between nodes B, B' within a relatively small range defined by the gain of amplifier 185.

Figure 6:
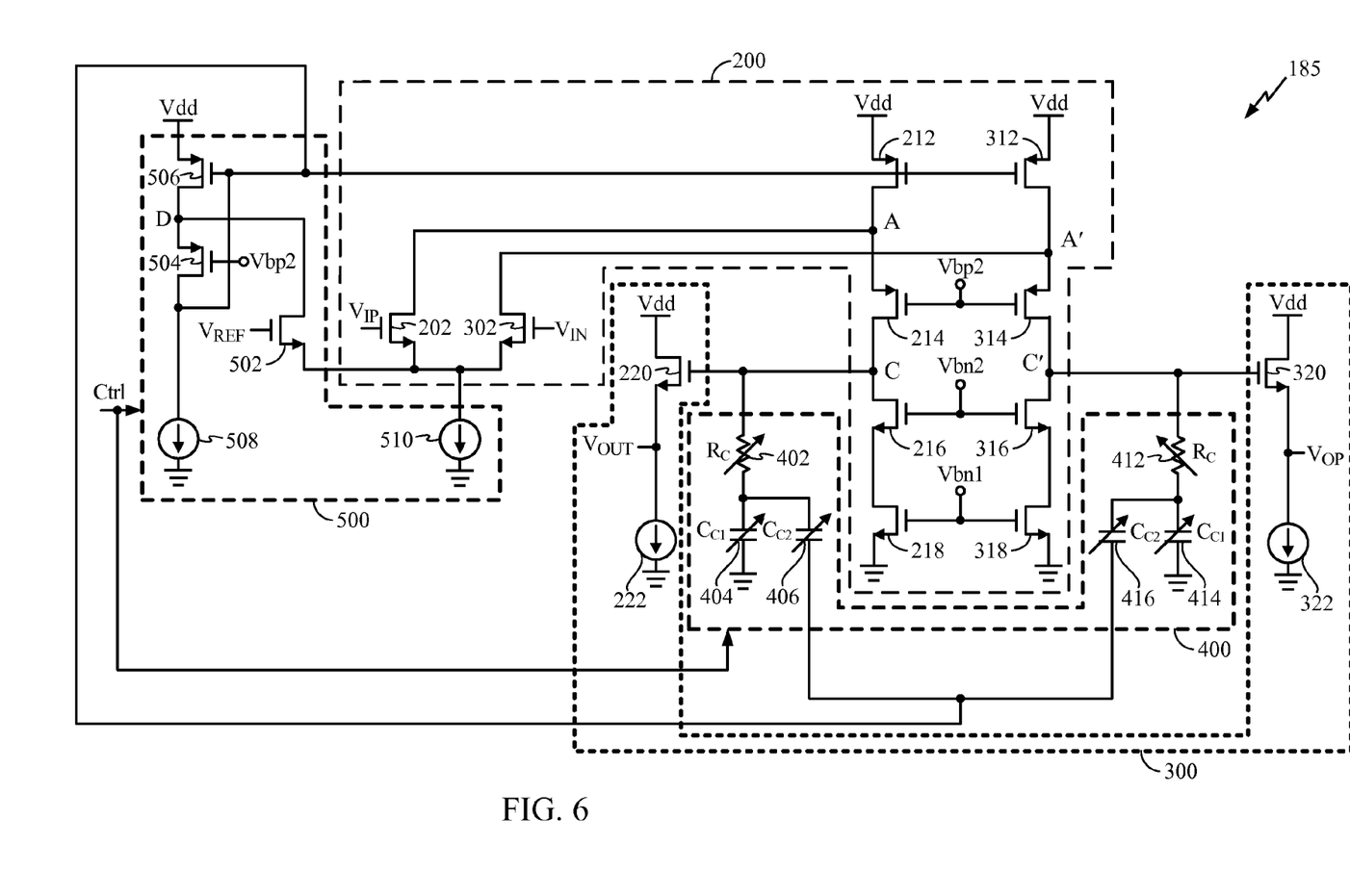
FIG. 6 is a transistor schematic diagram of the amplifier disposed in the DAC FIG. 5, in accordance with one exemplary embodiment of the present invention.

FIG. 6 is a transistor schematic diagram of amplifier 185 of FIG. 5, in accordance with one exemplary embodiment of the present invention. Amplifier 185 is shown as including a folded-cascode amplifier 200, a differential output buffer 300, a frequency compensation block 400, and a common-mode feedback loop 500.

Transistors 202 and 302 respectively receive voltages Vip and Vin of nodes B, B' (see FIG. 5). Transistors 202 and 302 together with current source 220 form the differential input pair of folded-cascode amplifier 200. Because the sum of the currents that can flow through transistors 202 and 302 is fixed and set by current source 220, when a differential voltage is applied between the gate terminals of transistors 202, 302, the current through one of these two transistors increases while the current through the other one of these transistors decreases. For example, assume voltage Vip is increased to be greater than voltage Vin. Accordingly, transistor 202 conducts more current while transistor 302 conducts less current. Because the impedance viewed from node A toward the drain terminal of transistor 212 is higher than the impedance viewed from node A toward the source terminal of transistor 214, the small signal current generated as a result of the increase in the gate voltage of transistor 202 flows through transistor 214 to node C. Likewise, the decrease in small signal current through transistor 302 flows from nodes A' to node C'. The impedance from node C toward the drain terminal of transistor 214 is relatively high and set by cascode transistor 214. Likewise, the impedance from node C toward the drain terminal of transistor 216 is also relatively high and set by cascode transistor 216. For the same reasons, the impedance at node C' is also relatively high. Accordingly, any changes in differential currents flowing though transistors 214, 314 results in relatively high differential voltages between nodes C, C'. The ratio of the difference in voltage between nodes C, C' and that between nodes B, B' (i.e., voltages Vip and Vin) is defined by the gain of folded-cascode amplifier 200. Accordingly, any small difference between voltages of nodes B, B' results in a substantially greater difference between voltages of nodes C, C'. (Sang, can you please provide a numerical example of these voltages/currents) The ratio of the difference between the voltages of nodes C, C' to the difference between the voltages of nodes B, B' is defined by the gain of cascode amplifier 200.

Transistor 220 together with current source 222 of output buffer 300 form a source-follower amplifier. Accordingly, output voltage Von of amplifier 185 follows the voltage of node C. Likewise, transistor 320 together with current source 322 of output buffer 300 form a source-follower amplifier. Accordingly, output voltage Vop of output terminal 0' follows the voltage of node C'. Output terminals of transistors 220, 230 have relatively low impedance values.

Variable resistors 402, 412 together with variable capacitors 404, 406, 416, 418 are used to compensate for the frequency response of amplifier 185 for both differential mode and common mode. As is explained further below, the resistances of variable resistors 402, 412 as well as the capacitances of variable capacitors 404, 406, 416, 418 may be varied using signal Ctrl to compensate for frequency response of amplifier 185.

Common-mode feedback loop 500 is shown as including transistors 502, 506, 504, and current sources 508, and 510. Common-mode feedback loop 500 is adapted to set the common-mode input voltage of amplifier 185 near reference voltage Vref. During the common mode, the same voltage is assumed to be applied to the input terminals of transistors 202, 302. Accordingly, due to the symmetry of folded cascode amplifier 200, during the common-mode, the voltages at nodes A, A' are assumed to be the same, as are the voltages at nodes C, C'. Therefore, during the common mode, transistor 502 can be assumed to form a differential pair with transistors 202, 302.

Assume for example, that the common-mode input voltage of amplifier 185, i.e., the average of input voltages Vip and Vin, becomes higher than voltage Vref. Because the sum of currents through transistors 202, 302, and 502 is defined by current source 510, such a common-mode input voltage increase causes the current through transistor 502 to decrease thereby causing the voltage at node D to increase. Because transistors 212, 312 and 506 form a current mirror, the increase in voltage at node D causes the voltages of nodes A, A' to decrease, in turn causing the voltages of nodes C, C', and hence the common-mode output voltage defined by voltages Vop, Von (i.e., voltages at the drain terminals of transistors 220 and 320) to decrease.

Referring to FIGS. 5 and 6 concurrently, the decrease in the common-mode output voltage of amplifier 185 causes transistors 140, 160 to become more conductive. Consequently, the voltages at nodes B, B' and hence the common-mode input voltage of amplifier 185 decreases to counter the initial increase in the common-mode input voltage of amplifier 185. Common-mode feedback loop 500 is thus adapted to maintain the common-mode input voltage of amplifier 185 within a narrow range of reference voltage Vref. Moreover, the virtual ground present between the input terminals of amplifier 185 maintains the differential-mode input voltage of amplifier 185, i.e., the difference in voltages of nodes B, B', within a small range (Sang, can you please provide a numerical example of these voltages/currents).

In accordance with one aspect of the present invention, control signal Ctrl is adapted to vary the common-mode gain bandwidth product of amplifier 185, thereby to control the harmonic distortion of amplifier 185. Signal Ctrl may be used to vary the current flow through variable current sources 508, 510, the capacitances of variable capacitors 404, 406, 414, 416, resistances of variable resistors 402, 412, and the channel-width (W) to channel-length (L) ratio of transistor 502 disposed in common-mode feedback loop 500.

By varying the currents through variable current sources 508 and 510, or W/L of transistor 502, the common-mode gain bandwidth product of amplifier 185 may be varied, thereby to change the harmonic distortion of amplifier 185. To perform frequency compensation at any selected common-mode gain, the resistances of variable resistors 402, 412, as well as the capacitance of variable capacitors 404, 406, 414, and 416 may also be varied using the control signal Ctrl.

Figure 7:
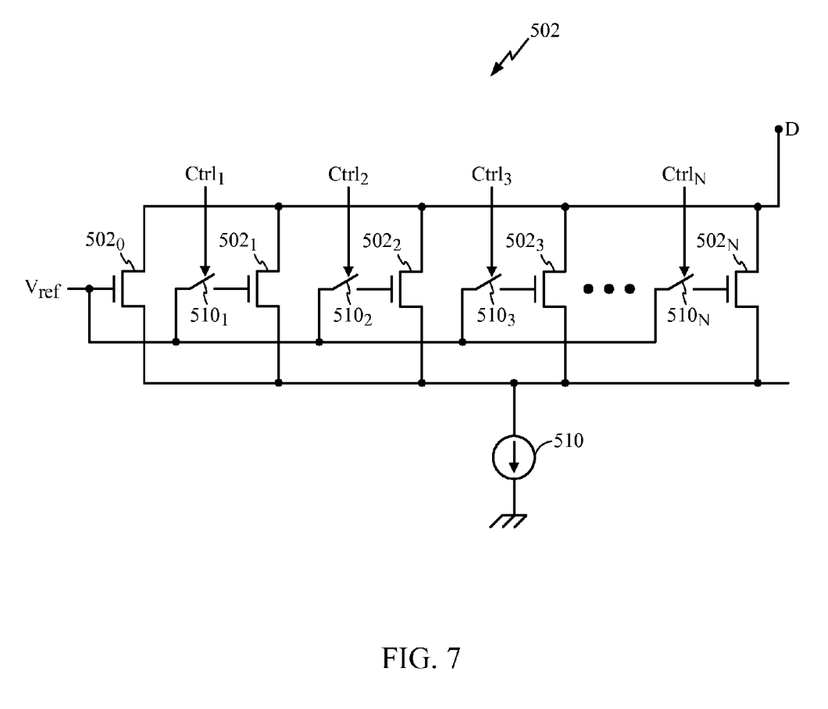
FIG. 7 is a simplified block diagram of a transistor having a variable channel-width to channel-length ratio as used in the amplifier of FIG. 6, in accordance with one exemplary embodiment of the present invention.

FIG. 7 is a schematic diagram of transistors 502$i$ ($i$ is an integer varying from 1 to N) connected in parallel to form transistor 502 of in FIG. 6, in accordance with one exemplary embodiment. Transistor 5020 receives reference voltage Vref and is connected between current source 510 and node D, as is also seen from FIG. 6. To increase the W/L of transistor 5020 one or more of transistors 502$i$ is selected by turning on an associated switch 510$i$. For example, to select transistor 5021 and thereby add its W/L to W/L of transistor 502—by adding more transistors in parallel to transistor 5020—switch 5101 is closed. This enables voltage Vref to be applied to the gate terminal of transistor 5021. Transistors 5020 and 5021 are then connected in parallel to have a higher W/L. Although not shown, the currents flowing through current sources 508 and 510 may also be varied to vary the common-mode gain bandwidth product and hence the harmonic distortion of amplifier 185.

The above embodiments of the present invention are illustrative and not limitative. The embodiments of the present invention are not limited by the resolution of a DAC. The embodiments of the present invention are not limited by the type of amplifier that may be used in the impedance attenuator. The embodiments of the present invention are not limited by the type of device, wireless or otherwise, in which the DAC may be disposed. Other additions, subtractions or modifications are obvious in view of the present disclosure and are intended to fall within the scope of the appended claims.

What is claimed is:

1. A digital-to-analog converter (DAC) comprising:
a plurality of input stages delivering currents to first and second current summing nodes in response to a digital signal received by the DAC;
a first transistor having a first terminal coupled to the first current summing node, and a second terminal coupled to a first output node of the DAC;
a second transistor having a first terminal coupled to the second current summing node, and a second terminal coupled to a second output node of the DAC; and
an amplifier having a first differential input terminal coupled to the first terminal of the first transistor, a second differential input terminal coupled to the first terminal of the second transistor, a first differential output terminal coupled to a gate terminal of the first transistor, and a second differential output terminal coupled to a gate terminal of the second transistor, said amplifier adapted to maintain an impedance of each of the first and second current summing nodes within a range defined by a gain of the amplifier.

2. The DAC of claim 1 wherein the DAC further comprises:
a first capacitor coupled between the gate terminal of the first transistor and the second current summing node; and
a second capacitor coupled between the gate terminal of the second transistor and the first current summing node.

3. The DAC of claim 1 wherein said amplifier further comprises a third input terminal receiving a control signal adapted to vary a common-mode gain of the amplifier.

4. The DAC of claim 3 wherein said amplifier further receives a reference voltage defining a common-mode input voltage of the amplifier.

5. The DAC of claim 4 wherein said amplifier further comprises:
a differential cascode input stage;
a differential source-follower amplification stage;
a common-mode feedback loop; and
a frequency compensation block.

6. The DAC of claim 5 wherein said differential cascode is a folded cascode.

7. The DAC of claim 5 wherein said frequency compensation block includes a plurality of capacitors and resistors adapted to compensate for a frequency response of the amplifier in both differential mode and common mode.

8. The DAC of claim 7 wherein said common-mode feedback loop is adapted to define the common-mode input voltage of the amplifier in accordance with the reference voltage.

9. The DAC of claim 8 wherein said common-mode feedback loop includes a first input transistor receiving the reference voltage and forming a differential pair with input transistors disposed in the differential cascode input stage.

10. The DAC of claim 9 wherein a channel-width to channel-length ratio of the first transistor of the common-mode feedback loop is selected by the control signal in order to vary a harmonic distortion of the amplifier.

11. The DAC of claim 9 wherein said amplifier further comprises a first current source coupled to the differential cascode input stage and the first transistor of the common-mode feedback loop, wherein said control signal is further adapted to vary a current of the first current source in order to vary a harmonic distortion of the amplifier.

12. The DAC of claim 9 wherein said control signal is further adapted to vary a current of a second current source disposed in the common-mode feedback loop in order to vary a harmonic distortion of the amplifier.

13. The DAC of claim 9 wherein said control signal is further adapted to vary a capacitance of at least one of the capacitors in the frequency compensation block.

14. A digital-to-analog converter (DAC) comprising:
a plurality of input stages delivering currents to first and second current summing nodes in response to a digital signal received by the DAC; and
a first transistor having a first terminal coupled to the first current summing node, and a second terminal coupled to a first output node of the DAC;
a second transistor having a first terminal coupled to the second current summing node, and a second terminal coupled to a second output node of the DAC;
a first amplifier having a first input terminal coupled to the first terminal of the first transistor, a second input terminal receiving a reference voltage, and an output terminal coupled to a gate terminal of the first transistor;
a second amplifier having a first input terminal coupled to a first terminal of the second transistor, a second input terminal receiving the reference voltage, and an output terminal coupled to a gate terminal of the second transistor;
a first capacitor coupled between the gate terminal of the first transistor and the second current summing node; and
a second capacitor coupled between the gate terminal of the second transistor and the first current summing node.

15. A method of converting a digital signal to an analog signal, the method comprising:
delivering first and second currents respectively to first and second current summing nodes in response to the digital signal;
coupling said first and second current summing nodes respectively to first and second differential input terminals of a differential amplifier;
varying, using the differential amplifier, a conductivity of a first current path in response to changes in voltage of the first current summing node in order to maintain an impedance of the first current summing node within a predefined range, wherein said first current path is adapted to couple the first current summing node to a first differential analog output voltage; and
varying, using the differential amplifier, a conductivity of a second current path in response to changes in voltage of the second current summing node in order to maintain an impedance of the second current summing node within the predefined range, wherein said second current path is adapted to couple the second current summing node to a second differential analog output voltage.

16. The method of claim 15 further comprising:
coupling a first capacitor between a first differential output of the amplifier and the second current summing node; and
coupling a second capacitor between a second differential output of the amplifier and the first current summing node.

17. The method of claim 15 further comprising:
varying a common-mode gain of the differential amplifier to vary a harmonic distortion of the differential amplifier using a control signal applied to the differential amplifier.

18. The method of claim 17 further comprising:
defining a common-mode input voltage of the differential amplifier in accordance with a reference voltage supplied to the differential amplifier.

19. The method of claim 18 further comprising:
forming a differential cascode between the differential input terminals of the amplifier; and
forming a differential source-follower amplification stage between differential output terminals of the amplifier.

20. The method of claim 19 wherein said differential cascode is a folded cascode.

21. The method of claim 18 further comprising:
compensating for frequency response of the differential amplifier using a plurality of capacitors and resistors.

22. The method of claim 18 further comprising:
varying a harmonic distortion of the differential amplifier by varying a channel-width to channel-length ratio of at least one transistor disposed in the differential amplifier.

23. The method of claim 18 further comprising:
varying a harmonic distortion of the differential amplifier by varying a current flow through at least one current source disposed in the differential amplifier.

24. The method of claim 21 further comprising:
varying a harmonic distortion of the differential amplifier by varying a capacitance of at least one of the plurality of capacitors.

25. A method for converting a digital signal to an analog signal, the method comprising:
delivering first and second currents to first and second current summing nodes in response to the digital signal;
coupling said first current summing node to a differential input terminal of a first amplifier;
coupling said second current summing node to a differential input terminal of a second amplifier;
varying, using the first amplifier, a conductivity of a first current path in response to changes in voltage of the first current summing node in order to maintain an impedance of the first current summing node within a predefined range, wherein said first current path is adapted to couple the first current summing node to a first differential analog output voltage;
varying, using the second amplifier, a conductivity of a second current path in response to changes in voltage of the second current summing node in order to maintain an impedance of the second current summing node within the predefined range defined, wherein said second current path is adapted to couple the second current summing node to a second differential analog output voltage;
coupling a first capacitor between the output of the first amplifier and the second current summing node; and
coupling a second capacitor between the output of the second amplifier and the first current summing node.

26. A non-transitory computer readable storage medium comprising instructions that when executed by a processor cause the processor to:
  deliver first and second currents respectively to first and second current summing nodes in response to a digital signal;
  couple said first and second current summing nodes respectively to first and second differential input terminals of a differential amplifier;
  vary, using the differential amplifier, a conductivity of a first current path in response to changes in voltage of the first current summing node in order to maintain an impedance of the first current summing node within a predefined range, wherein said first current path is adapted to couple the first current summing node to a first differential analog output voltage; and
  vary, using the differential amplifier, a conductivity of a second current path in response to changes in voltage of the second current summing node in order to maintain an impedance of the second current summing node within the predefined range, wherein said second current path is adapted to couple the second current summing node to a second differential analog output voltage.

27. The non-transitory computer readable storage medium of claim 26 wherein the instructions further cause the processor to:
  couple a first capacitor between a first differential output of the amplifier and the second current summing node; and
  couple a second capacitor between a second differential output of the amplifier and the first current summing node.

28. The non-transitory computer readable storage medium of claim 26 wherein the instructions further cause the processor to:
  vary a common-mode gain of the differential amplifier to vary a harmonic distortion of the differential amplifier using a control signal applied to the differential amplifier.

29. The non-transitory computer readable storage medium of claim 28 wherein the instructions further cause the processor to:
  define a common-mode input voltage of the differential amplifier in accordance with a reference voltage supplied to the differential amplifier.

30. The non-transitory computer readable storage medium of claim 29 wherein the instructions further cause the processor to:
  form a differential cascode between the differential input terminals of the amplifier; and
  form a differential source-follower amplification stage between differential output terminals of the amplifier.

31. The non-transitory computer readable storage medium of claim 29 wherein said differential cascode is a folded cascode.

32. The non-transitory computer readable storage medium of claim 29 wherein the instructions further cause the processor to:
  compensate for frequency response of the differential amplifier using a plurality of capacitors and resistors.

33. The non-transitory computer readable storage medium of claim 29 wherein the instructions further cause the processor to:
  vary a harmonic distortion of the differential amplifier by varying a channel-width to channel-length ratio of at least one transistor disposed in the differential amplifier.

34. The non-transitory computer readable storage medium of claim 29 wherein the instructions further cause the processor to:
  vary a harmonic distortion of the differential amplifier by varying a current flow through at least one current source disposed in the differential amplifier.

35. The non-transitory computer readable storage medium of claim 32 wherein the instructions further cause the processor to:
  vary a harmonic distortion of the differential amplifier by varying a capacitance of at least one of the plurality of capacitors.

36. A non-transitory computer readable storage medium comprising instructions that when executed by a processor causes the processor to:
  deliver first and second currents respectively to first and second current summing nodes in response to a digital signal;
  couple said first current summing node to a differential input terminal of a first amplifier;
  couple said second current summing node to a differential input terminal of a second amplifier;
  vary, using the first amplifier, a conductivity of a first current path in response to changes in voltage of the first current summing node in order to maintain an impedance of the first current summing node within a predefined range, wherein said first current path is adapted to couple the first current summing node to a first differential analog output voltage;
  vary, using the second amplifier, a conductivity of a second current path in response to changes in voltage of the second current summing node in order to maintain an impedance of the second current summing node within the predefined range, wherein said second current path is adapted to couple the second current summing node to a second differential voltage representing the analog voltage;
  couple a first capacitor between the output of the first amplifier and the second current summing node; and
  couple a second capacitor between the output of the second amplifier and the first current summing node.

37. A digital-to-analog converter (DAC) comprising:
  means for delivering first and second currents respectively to first and second current summing nodes in response to a digital signal;
  means for coupling said first and second current summing nodes respectively to first and second differential input terminals of a differential amplifier;
  means for varying a conductivity of a first current path in response to changes in voltage of the first current summing node in order to maintain an impedance of the first current summing node within a predefined range, wherein said first current path is adapted to couple the first current summing node to a first differential analog output voltage; and
  means for varying a conductivity of a second current path in response to changes in voltage of the second current summing node in order to maintain an impedance of the second current summing node within the predefined range, wherein said second current path is adapted to couple the second current summing node to a second differential analog output voltage.

38. The DAC of claim 37 further comprising:
  means for coupling a first capacitor between a first differential output of the differential amplifier and the second current summing node; and means for coupling a second capacitor between a second differential output of the differential amplifier and the first current summing node.

39. The DAC of claim 37 further comprising:
means for varying a common-mode gain of the differential amplifier to vary a harmonic distortion of the differential amplifier using a control signal applied to the differential amplifier.

40. The DAC of claim 39 further comprising:
means for defining a common-mode input voltage of the differential amplifier in accordance with a reference voltage supplied to the differential amplifier.

41. The DAC of claim 40 further comprising:
means for forming a differential cascode between the differential input terminals of the differential amplifier; and
means for forming a differential source-follower amplification stage between the differential output terminals of the differential amplifier.

42. The DAC of claim 41 wherein said differential cascode is a folded cascode.

43. The DAC of claim 40 further comprising:
means for compensating for frequency response of the differential amplifier.

44. The DAC of claim 40 further comprising:
means for varying a harmonic distortion of the differential amplifier by varying a channel-width to channel-length ratio of at least one transistor disposed in the differential amplifier.

45. The DAC of claim 40 further comprising:
means for varying a harmonic distortion of the differential amplifier by varying a current flow through at least one current source disposed in the differential amplifier.

46. The DAC of claim 43 further comprising:
means for varying a harmonic distortion of the differential amplifier by varying a capacitance of at least one capacitor.

47. A digital-to-analog converter (DAC) comprising:
means for delivering first and second currents respectively to first and second current summing nodes in response to a digital signal;
means for coupling said first current summing node to a differential input terminal of a first amplifier;
means for coupling said second current summing node to a differential input terminal of a second amplifier;
means for varying a conductivity of a first current path in response to changes in voltage of the first current summing node in order to maintain an impedance of the first current summing node within a predefined range, wherein said first current path is adapted to couple the first current summing node to a first differential voltage representing the analog voltage;
means for varying a conductivity of a second current path in response to changes in voltage of the second current summing node in order to maintain an impedance of the second current summing node within the predefined range defined, wherein said second current path is adapted to couple the second current summing node to a second differential voltage representing the analog voltage;
means for coupling a first capacitor between the output of the first conductivity varying means and the second current summing node; and
means for coupling a second capacitor between the output of the second conductivity varying means and the first current summing node.

\* \* \* \* \*